United States Patent
Hilliger

(10) Patent No.: US 6,611,449 B1
(45) Date of Patent: Aug. 26, 2003

(54) CONTACT FOR MEMORY CELLS

(75) Inventor: Andreas Hilliger, Kanagawa (JP)

(73) Assignee: Infineon Technologies Aktiengesellschaft, Munich (DE)

( * ) Notice: Subject to any disclaimer, the term of this patent is extended or adjusted under 35 U.S.C. 154(b) by 0 days.

(21) Appl. No.: 10/065,166

(22) Filed: Sep. 24, 2002

(51) Int. Cl.[7] ............................................. G11C 11/22
(52) U.S. Cl. ........................ 365/145; 365/145; 365/164; 365/72
(58) Field of Search ................................. 257/295, 296, 257/776, 774; 437/190; 438/678, 396

(56) References Cited

U.S. PATENT DOCUMENTS

| | | | | |
|---|---|---|---|---|
| 5,789,320 A | * | 8/1998 | Andricacos et al. | ........ 438/678 |
| 5,866,946 A | * | 2/1999 | Kamigaki et al. | ........... 257/751 |
| 6,037,235 A | * | 3/2000 | Narwankar et al. | ......... 438/396 |
| 6,281,535 B1 | * | 8/2001 | Ma et al. | ..................... 257/295 |
| 6,320,213 B1 | * | 11/2001 | Kirlin et al. | ................ 257/295 |
| 6,365,927 B1 | * | 4/2002 | Cuchiaro et al. | ........... 257/295 |

OTHER PUBLICATIONS

US patent application Publication US 2002/0040988 by Hidaka et al.*

* cited by examiner

Primary Examiner—David Nelms
Assistant Examiner—Thinh T. Nguyen
(74) Attorney, Agent, or Firm—Dexter Chin

(57) ABSTRACT

A memory cell which provides a diffusion path for hydrogen to the transistor is disclosed. The diffusion path is provided by forming a contact in which the upper section overlaps the lower section, thus creating a gap that serve as a hydrogen diffusion path. The hydrogen diffusion path is necessary for annealing the damage to the gate oxide.

12 Claims, 7 Drawing Sheets

US 6,611,449 B1

CONTACT FOR MEMORY CELLS

BACKGROUND OF THE INVENTION

FIG. 1 shows a cross-section of a ferroelectric memory cell 101. The memory cell includes a transistor 130 formed on a substrate 105. The transistor includes a gate 133 and first and second diffusion regions 131 and 132. A capacitor 140 is coupled to one of the diffusion regions of the transistor via a conductive lower capacitor plug 151. The capacitor includes a ferroelectric layer 144 disposed between first and second electrodes 143 and 145. Typically, a barrier layer 142 is provided between the plug and the electrode of the capacitor to inhibit diffusion of oxygen which can oxidize the plug. An encapsulation layer 167 is provided over the capacitor. The encapsulation layer serves to prevent hydrogen from penetrating the ferroelectric layer.

Coupled to the other diffusion region is a plug. The plug can be coupled to, for example, a bitline. In some applications (e.g., series architecture), the other diffusion region is coupled to the top capacitor electrode 145. Series architectures, for are described in Takashima et al., *IEEE JOURNAL. SOLID-STATE CIRCUITS*, VOL. 33, pp 787–792, May 1998 and "A Sub–40ns Chain FRAM Architecture with 7ns Cell-Plate-Line Drive", *IEEE JOURNAL OF SOLID-STATE CIRCUITS*. VOL.34. NO. 1, which are herein incorporated by reference for all purposes. Typically, the plug is formed in two processes. The first process forms a lower portion 174. Above the lower portion of the plug is a barrier layer 176 to protect the gate stack and contact from oxidizing during an oxygen recovery anneal.

During processing, the gate oxide of the transistor suffers degradation due to charging up of the interface states. To repair the gate oxide, a hydrogen containing anneal is performed. The anneal is performed during back-end-of-line (BEOL) process. However, the encapsulation and the lower barrier layers prevent hydrogen from penetrating to the transistor to anneal the damage of the gate oxide.

From the foregoing discussion, it is desirable to provide a diffusion path for hydrogen to improve the properties of the gate oxide.

SUMMARY OF THE INVENTION

The invention relates generally to memory ICs. More particularly, the invention relates to ferroelectric ICs. In one embodiment, a memory cell includes a transistor having a gate and first and second diffusion regions formed on a substrate. A capacitor is coupled to one of the diffusion regions via a first plug. A second plug is coupled to the second diffusion region.

In accordance with one embodiment of the invention, the second plug comprises first and second sections. The second section overlaps the first section to create a gap for diffusion of hydrogen to the transistor to anneal the gate oxide damage.

DETAILED DESCRIPTION

Figure 1:
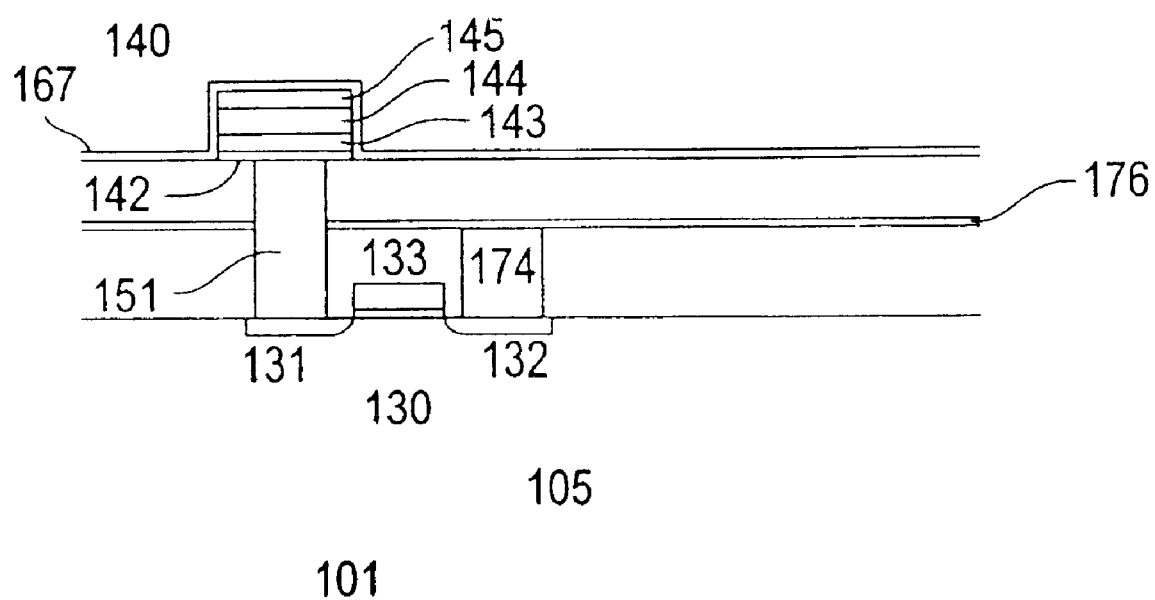
FIG. 1 shows a cross-section of a ferroelectric memory cell.
Figure 2:
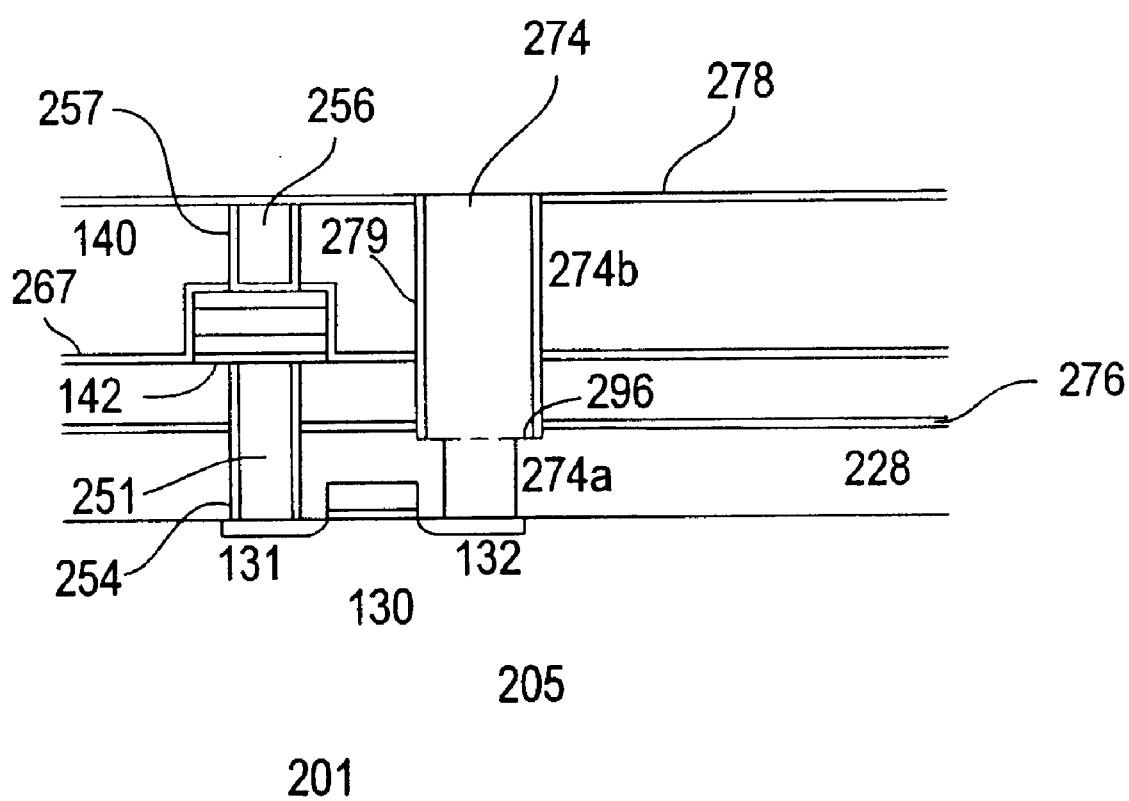
FIG. 2 shows a cross-section of a ferroelectric memory cell in accordance with one embodiment of the invention.

FIG. 2 shows a cross-section of a ferroelectric memory cell 201 in accordance with one embodiment of the invention. The memory cell includes a transistor 130 formed on a semiconductor substrate 205. The transistor, for example, comprises an n-FET. Other types of transistors are also useful. A first diffusion region 131 of the transistor is coupled to a capacitor 140 by a conductive lower capacitor plug 251. The plug, for example, comprises tungsten or poly-Si. A dielectric layer 228 provides isolation between the different levels of the memory cell. The dielectric layer can be formed from, for example, silicon oxide. Other types of dielectric materials can also be used.

In one embodiment, the capacitor is a ferroelectric capacitor. Other types of capacitors are also useful. The ferroelectric capacitor includes a ferroelectric layer, such as PZT, located between first and second conductive electrodes. Other types of ferroelectric materials (e.g., strontium bismuth tantalum or SBT) can also be used.

Various anneals in an oxygen ambient are required during the fabrication process to, for example, repair etch damage or to recover the properties of the ferroelectric layer. However, the oxygen can oxidize the plug. To prevent such negative impact, a barrier 142 layer is provided between the plug and electrode of the capacitor. The barrier layer, for example, comprises a conductive material such as iridium. Other types of barrier materials can also be used. In addition, an encapsulation layer 267 is provided over the capacitor. The encapsulation, in one embodiment, comprises aluminum oxide ($Al_2O_3$). Other types of non-conductive barrier materials can also be used.

An upper capacitor plug 256 is provided above the capacitor. In one embodiment, the plug is formed from aluminum. Other types of conductive material, such as tungsten, can also be used. The plug couples the capacitor to, for example, a conductive line, such as a plate line of the memory IC. For series architecture, the plug is coupled to the other diffusion region of the transistor. To prevent interaction between plug and top electrode, a liner layer 257 can be provided.

A contact plug 274 is coupled to a second diffusion region 132 of the transistor. The contact plug, for example, is coupled to a bit line of the memory IC. In accordance with one embodiment of the invention, the contact plug comprises a first (lower) and second (upper) sections 274a and 274b.

In one embodiment, a barrier against hydrogen (hydrogen barrier) is provided to prevent diffusion of hydrogen to the capacitor during the hydrogen anneal. This is because hydrogen can adversely impact the performance of the ferroelectric capacitor. In one embodiment, a hydrogen barrier layer is provided on the surface of the dielectric layer (278), sidewalls of the upper section of the contact (279), and between the transistor and capacitor (276). Optionally, the sidewalls of plug 251 are also lined with a hydrogen barrier 254. The barrier, in one embodiment, comprises aluminum oxide or silicon nitride. Other types of materials which prevent diffusion of hydrogen are also useful. As previously described, the barrier layers prevent the penetration of hydrogen to the transistor which is necessary to anneal the damage of the gate oxide.

In accordance with one embodiment of the invention, the upper section overlaps the lower section, creating a gap 296 to provide a diffusion path for hydrogen to the transistor. In one embodiment, the upper section overlaps the lower section at least on one side. Preferably, the upper section overlaps the lower section on at least two sides. More preferably, the upper section comprises a rectangular shape for overlapping the lower section. Even more preferably, the upper and lower sections are rectangular in shape and aligned in a cross-configuration. This advantageously increases the margin of error between the alignment of upper and lower contact sections as well as providing a diffusion path for hydrogen. Alternatively, other shapes or configurations between the upper and lower contact sections which create a gap or gaps to enable diffusion of hydrogen to the transistor are also useful.

Figure 3:
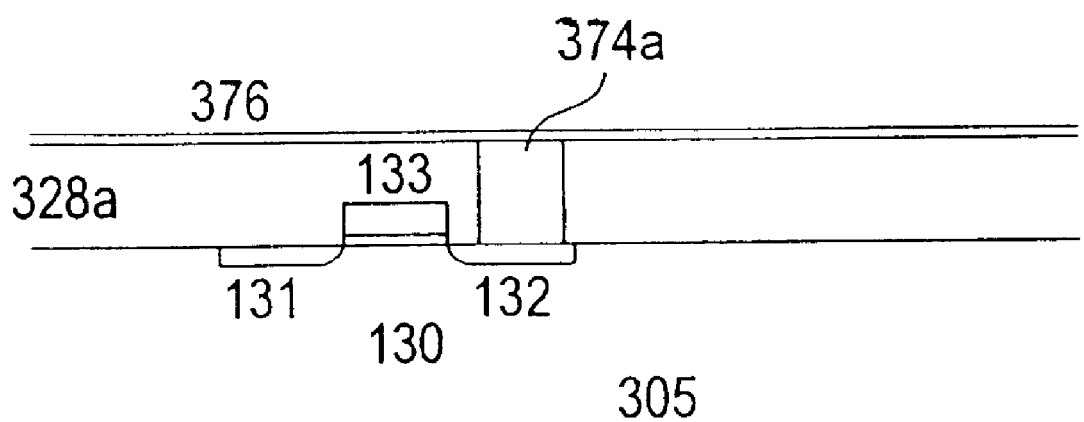
FIGS. 3–7 show a process for forming a memory cell in accordance with one embodiment of the invention.

FIGS. 3–7 show a process for forming the memory cell in accordance with one embodiment of the invention. Referring to FIG. 3, a semiconductor substrate 305 is provided. The substrate is prepared with a transistor 130 having a gate 133 and first and second diffusion regions 131 and 132. A first dielectric layer 328a is formed over transistor.

In one embodiment, a contact opening is formed in the dielectric layer. The contact opening is formed using conventional mask and etch techniques. The contact opening exposes the second diffusion region of the transistor. Subsequently, a conductive material is deposited on the substrate, filling the contact opening. The conductive material, for example, comprises tungsten. Other materials, such as poly-Si, can also be used. The tungsten is deposited, in one embodiment, by metal-organic CVD. Excess conductive material on the surface of the dielectric layer is removed by, for example, chemical mechanical polishing to form contact plug 374a. Other techniques for removing excess conductive materials can also be used. A liner can be provided. For example a titanium/titanium nitride liner can be provided for a tungsten plug.

In one embodiment, an oxygen barrier layer 376 is deposited over the first dielectric layer and on top of the W-filled plugs in order to prevent them from being oxidized during subsequent oxygen anneals of the capacitor. The hydrogen barrier, for example, comprises silicon nitride. Alternatively, the barrier layer is formed from aluminum oxide or other materials which sufficiently prevent diffusion of oxygen. The barrier layer is deposited by, for example, chemical vapor deposition (CVD) techniques such as low pressure CVD. Other deposition techniques for depositing the barrier layer, such as plasma-enhanced CVD or sputtering can also be useful. Additionally such oxygen barriers also act as hydrogen barriers as long as $Al_2O_3$ or $Si_3N_4$ are concerned.

Figure 4:
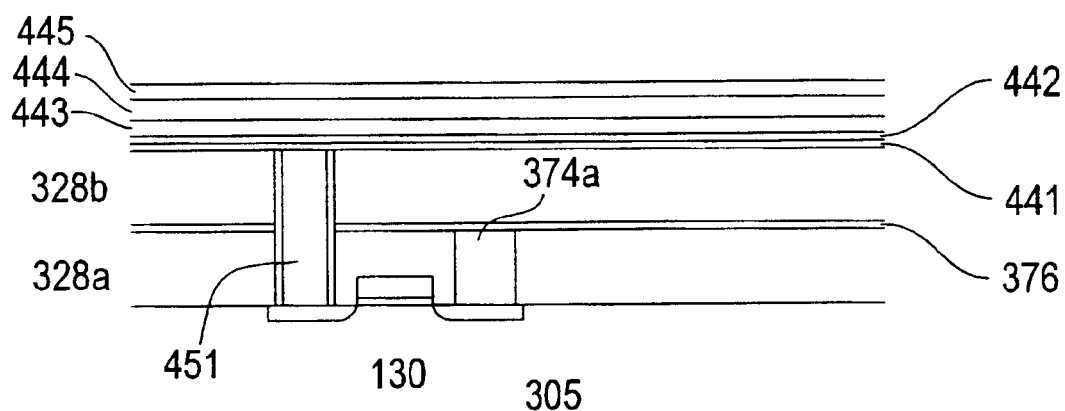

Referring to FIG. 4, a second dielectric layer 328b is deposited on the substrate. In one embodiment, the second dielectric layer comprises silicon oxide deposited by, for example, LP CVD. Other deposition techniques are also useful.

A lower capacitor plug 451 coupling to the first diffusion region of the transistor is formed. The formation of the plug is achieved using conventional etch, mask and fill techniques. For example, a photoresist layer is deposited on the dielectric layer and selectively patterned to create an opening, exposing a portion of the dielectric layer beneath. The exposed portion of the dielectric layer is then removed by, for example, a reactive ion etch (RIE). The RIE forms a contact opening in the dielectric layer to expose the first diffusion region of the transistor.

In accordance with one embodiment of the invention, an oxygen barrier layer 462 is deposited on the substrate to prevent the surface of the contact from oxidation during subsequent oxygen anneals. The oxygen barrier comprises, for example, silicon nitride. Other barrier materials which prevent diffusion of oxygen can also be used. The barrier layer is, for example, deposited by LP CVD or other conventional deposition techniques.

The barrier layer lines the surface of the substrate and contact opening. An etch is performed to remove the horizontal portion of the barrier layer (e.g., surface of the dielectric layer and diffusion region). This etch is not necessary for conductive barrier layer. A conductive layer is deposited, filling the contact opening. Excess conductive materials are removed from the surface of the dielectric layer by, for example, CMP. If the barrier layer remains on the surface of the dielectric layer, it is also removed by the CMP.

The process continues to form the ferroelectric capacitor. In one embodiment, an adhesion and barrier layers 441 and 442 are deposited on the dielectric layer. The adhesion layer, for example, comprises titanium or other types of materials which promote adhesion between the dielectric layer and barrier layer. The barrier layer, in one embodiment, comprises iridium. Other barrier layers, such as iridium oxide which prevents diffusion of oxygen, are also useful. Above the barrier layer, first electrode, ferroelectric and second electrode layers are sequentially deposited. In one embodiment, the electrodes comprise a noble metal such as platinum while the ferroelectric layer is PZT. Other electrode and ferroelectric materials are also useful. The various layers can be deposited using conventional techniques, such as sputtering.

Figure 5:
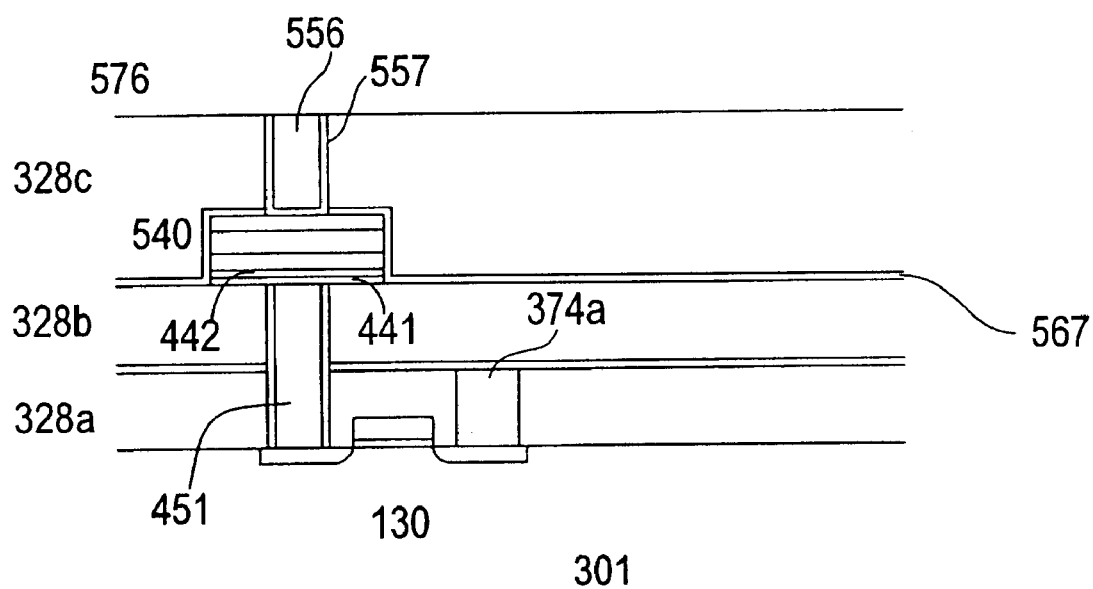

Referring to FIG. 5, the various layers are patterned to form the ferroelectric capacitor 540. Depending on the application, the various layers can be patterned simultaneously or in multiple steps. For example, in chained architecture, the capacitor layers are patterned in two steps. The first step patterns the bottom electrode and layers beneath while the second step patterns the layers above the bottom electrode. At least one encapsulation layer 567 is deposited over the substrate, covering the capacitor and dielectric layer. The encapsulation layer serves to prevent hydrogen from diffusing into the capacitor dielectric material as well as preventing oxygen from diffusing to the interface between the plug 451 and the adhesion layer 441, oxidizing both layers. In one embodiment, the encapsulation layer comprises aluminum oxide. Other types of materials, such as titanium oxide or silicon nitride, are also useful.

A third dielectric layer 328c is deposited over the substrate, covering the capacitor. In one embodiment, the dielectric layer comprises silicon oxide. Other dielectric materials are also useful. The dielectric layer is deposited by, for example, CVD. Other deposition techniques are also useful. In one embodiment, an upper contact 556 is formed in the dielectric layer using, for example, conventional damascene techniques. The contact is coupled to the upper electrode of the capacitor. A liner layer 557 can be provided to line the contact. Such a layer serves to prevent interaction between the materials of the contact and top capacitor electrode.

Figure 6:
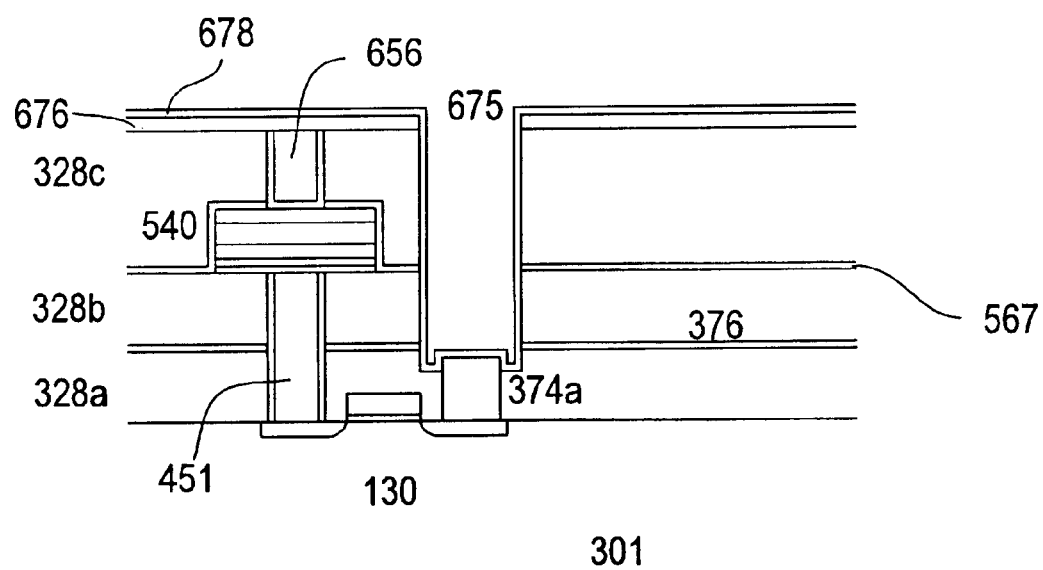

Referring to FIG. 6, a barrier layer 676 is deposited on the surface of the dielectric layer. Thereafter, a contact opening 675 is form using conventional mask and etch techniques to expose the contact plug 374a. The contact opening serves as the opening in which the upper section of a contact plug is formed. In one embodiment, the opening is larger than the lower section of the plug. The upper section overlaps the lower section at least on one side. Preferably, the upper portion overlaps the lower section on at least two sides. More preferably, the upper section comprises a rectangular shape for overlapping the lower section. Even more preferably, the upper and lower sections are rectangular in shape and aligned in a cross-configuration. This advantageously increases the margin of error between the alignment of upper and lower contact sections as well as providing a diffusion path for hydrogen.

In one embodiment, an over etch is performed, ensuring that the lower plug is exposed as well as removing some dielectric material below the barrier 376. A second hydrogen barrier layer 678 is deposited on the substrate, covering the substrate and lining the upper section of the contact opening and contact plug.

Figure 7:
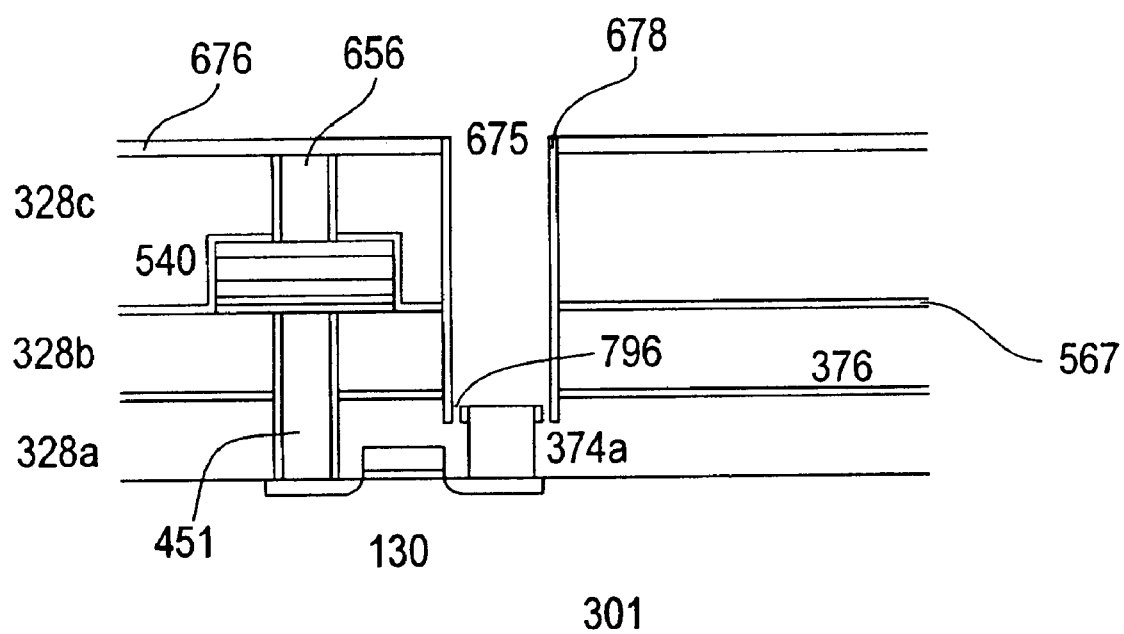

Referring to FIG. 7, an anisotropic etch (e.g., RIE) is performed to remove the horizontal portion of the second hydrogen barrier layer. The etch exposes the lower plug and provides a hydrogen diffusion path 796. In one embodiment, a hydrogen or hydrogen-containing (e.g., mixture of hydrogen and nitrogen) anneal is performed to repair the gate oxide. The anneal, for example, is performed at a temperature of about 400° C. for about 30 minutes. During the anneal, hydrogen diffuses to the gate oxide via upper section of contact opening and gap 796. The hydrogen, however, is prevented from diffusing to the capacitor due to barrier layers 376, 676, and 678. After the anneal, a conductive material is deposited on the substrate, filling the upper section of contact opening. Excess conductive material is removed by, for example, CMP. The CMP also removes the barrier layer 676 on the surface of the dielectric layer 328c, exposing contact plug 656. Conductive lines are then formed, for example, platelines and bitlines. The conductive lines are formed by, for example, conventional RIE or damascene techniques. In an alternative embodiment, the upper part of the contact can be formed after contact 374a is formed.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A memory cell comprising:
    a transistor having first and second diffusion regions and a gate formed on a substrate;
    a capacitor having a dielectric layer between first and second electrodes;
    a first plug coupled to the first electrode and first diffusion region;
    a dielectric layer covering the transistor and capacitor; and
    a second plug formed in the dielectric layer, the second plug is coupled to the second diffusion region, the second plug comprising first and second sections, wherein the second section overlaps the first section, the overlap creates a gap, the gap serves as a diffusion path for hydrogen to the transistor.

2. The memory cell of claim 1 wherein the dielectric layer comprises a ferroelectric material to form a ferroelectric capacitor.

3. The memory cell of claim 2 further comprises:
    a first hydrogen barrier lining sidewalls of the second section of the second plug;
    a surface hydrogen barrier on a surface of the dielectric layer; and
    a second hydrogen barrier between the capacitor and transistor, the second hydrogen barrier abutting sidewalls of the second section to form a barrier against the diffusion of hydrogen from below the capacitor.

4. The memory cell of claim 3 further comprises a third hydrogen barrier lining sidewalls of the first plug.

5. The memory cell of claim 1 further comprises:
    a first hydrogen barrier lining sidewalls of the second section of the second plug;
    a surface hydrogen barrier on a surface of the dielectric layer; and
    a second hydrogen barrier between the capacitor and transistor, the second hydrogen barrier abutting sidewalls of the second section to form a barrier against the diffusion of hydrogen from below the capacitor.

6. The memory cell of claim 5 further comprises a third hydrogen barrier lining sidewalls of the first plug.

7. The memory cell of any of the claims 1–6 wherein the second section overlaps the first section on at least one side.

8. The memory cell of claim 7 wherein the second section overlaps the first section on at least two sides.

9. The memory cell of claim 7 wherein the second section overlaps the first section on all sides.

10. The memory cell of claim 7 wherein the second section comprises a rectangular shape for overlapping the first section.

11. The memory cell of claim 7 wherein the first and second sections are rectangular and aligned in a cross-configuration.

12. The memory cell of claim 7 wherein the first and second sections are aligned in a cross-configuration.

* * * * *

UNITED STATES PATENT AND TRADEMARK OFFICE
CERTIFICATE OF CORRECTION

| | | |
|---|---|---|
| PATENT NO. | : 6,611,449 B1 | Page 1 of 1 |
| APPLICATION NO. | : 10/065166 | |
| DATED | : August 26, 2003 | |
| INVENTOR(S) | : Andreas Hilliger | |

It is certified that error appears in the above-identified patent and that said Letters Patent is hereby corrected as shown below:

In column 1, line 22 - replace "Series architectures, for are described in Takashima et al.," with --Series architectures, for example, are described in Takashima et al.,--

In column 1, line 26 - replace "IEEE JOURNAL OF SOLID-STATE CIRCUITS. VOL. 34. NO. 1" with --IEEE JOURNAL OF SOLID-STATE CIRCUITS. VOL. 34. NO. 11--

Signed and Sealed this

Twenty-fourth Day of October, 2006

JON W. DUDAS
*Director of the United States Patent and Trademark Office*